(12) United States Patent
Pham et al.

(10) Patent No.: US 9,070,657 B2
(45) Date of Patent: Jun. 30, 2015

(54) HEAT CONDUCTIVE SUBSTRATE FOR INTEGRATED CIRCUIT PACKAGE

(71) Applicant: Freescale Semiconductor, Inc., Austin, TX (US)

(72) Inventors: Tim V. Pham, Austin, TX (US); Derek S. Swanson, Austin, TX (US); Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/048,721

(22) Filed: Oct. 8, 2013

(65) Prior Publication Data

US 2015/0097280 A1    Apr. 9, 2015

(51) Int. Cl.
*H01L 23/36* (2006.01)
*H01L 25/065* (2006.01)
*H01L 25/00* (2006.01)

(52) U.S. Cl.
CPC ............ *H01L 23/36* (2013.01); *H01L 25/0657* (2013.01); *H01L 25/50* (2013.01)

(58) Field of Classification Search
None
See application file for complete search history.

(56) References Cited

U.S. PATENT DOCUMENTS

| | | | |
|---|---|---|---|
| 5,604,377 A * | 2/1997 | Palagonia | 257/685 |
| 6,057,176 A | 5/2000 | King | |
| 6,294,838 B1 | 9/2001 | Peng | |
| 6,376,917 B1 * | 4/2002 | Takeshita et al. | 257/778 |
| 6,437,433 B1 * | 8/2002 | Ross | 257/692 |
| 6,472,741 B1 * | 10/2002 | Chen et al. | 257/712 |
| 6,489,678 B1 | 12/2002 | Joshi | |
| 6,552,910 B1 | 4/2003 | Moon et al. | |
| 6,603,072 B1 | 8/2003 | Foster et al. | |
| 6,750,545 B1 | 6/2004 | Lee et al. | |
| 6,833,993 B2 * | 12/2004 | Wang | 361/704 |
| 6,847,102 B2 | 1/2005 | Gerber et al. | |
| 6,858,932 B2 | 2/2005 | Gerber et al. | |
| 6,867,072 B1 | 3/2005 | Shiu et al. | |
| 6,879,028 B2 | 4/2005 | Gerber et al. | |
| 6,980,438 B2 * | 12/2005 | Huang et al. | 361/719 |
| 7,030,469 B2 | 4/2006 | Mahadevan et al. | |

(Continued)

FOREIGN PATENT DOCUMENTS

JP    10079405 A  *  3/1998

OTHER PUBLICATIONS

Wikipedia, Flip Chip, Retrieved from http://en.wikipedia.org/w/index.php?title=Flip_chip&oldid=561419634, 4 pages.

(Continued)

*Primary Examiner* — Allen Parker
(74) *Attorney, Agent, or Firm* — Kelly Kordzik; Matheson Keys & Kordzik PLLC

(57) ABSTRACT

An integrated circuit package includes a substrate having a heat conducting portion integrally formed with a heat dissipating portion. First and second integrated circuit dies are mounted to opposite sides of the heat conducting portion of the substrate. The first and second integrated circuit dies may each be packaged as flip-chip configurations. Electrical connections between contact pads on the first and second integrated circuit dies may be formed through openings formed in the heat conducting portion of the substrate. The heat dissipating portion may be positioned externally from a location between the first and second integrated circuit dies so that it dissipates heat away from the integrated circuit package into the surrounding environment.

19 Claims, 12 Drawing Sheets

(56) References Cited

U.S. PATENT DOCUMENTS

| | | |
|---|---|---|
| 7,033,866 B2 | 4/2006 | Chow et al. |
| 7,429,792 B2 * | 9/2008 | Lee et al. ............... 257/712 |
| 7,482,679 B2 | 1/2009 | Aripin et al. |
| 7,927,927 B2 | 4/2011 | Quan et al. |
| 7,947,529 B2 | 5/2011 | Koon et al. |
| 8,008,786 B2 | 8/2011 | Pham et al. |
| 8,110,905 B2 | 2/2012 | Park et al. |
| 8,119,447 B2 | 2/2012 | Pagaila et al. |
| 8,154,116 B2 * | 4/2012 | Sasaki et al. ............ 257/713 |
| 8,338,922 B1 | 12/2012 | Sirinorakul et al. |
| 8,358,017 B2 | 1/2013 | Tsui |
| 8,415,779 B2 | 4/2013 | Wong et al. |
| 2003/0227751 A1 * | 12/2003 | Wang ..................... 361/719 |
| 2006/0006517 A1 * | 1/2006 | Lee et al. ............... 257/686 |
| 2007/0200253 A1 | 8/2007 | Gogoi et al. |
| 2011/0227207 A1 | 9/2011 | Yilmaz et al. |
| 2011/0298114 A1 | 12/2011 | Pruitt |
| 2012/0074581 A1 | 3/2012 | Guzek et al. |
| 2012/0238058 A1 | 9/2012 | Luo et al. |
| 2012/0326288 A1 | 12/2012 | Huang et al. |
| 2013/0005087 A1 | 1/2013 | Chen et al. |
| 2013/0070438 A1 | 3/2013 | Choi et al. |
| 2013/0105974 A1 | 5/2013 | Tsui |

OTHER PUBLICATIONS

Texas Instruments, Flip Chip Ball Grid Array Package Reference Guide, Literature Number: SPRU811A, May 2005, 36 pages.

\* cited by examiner

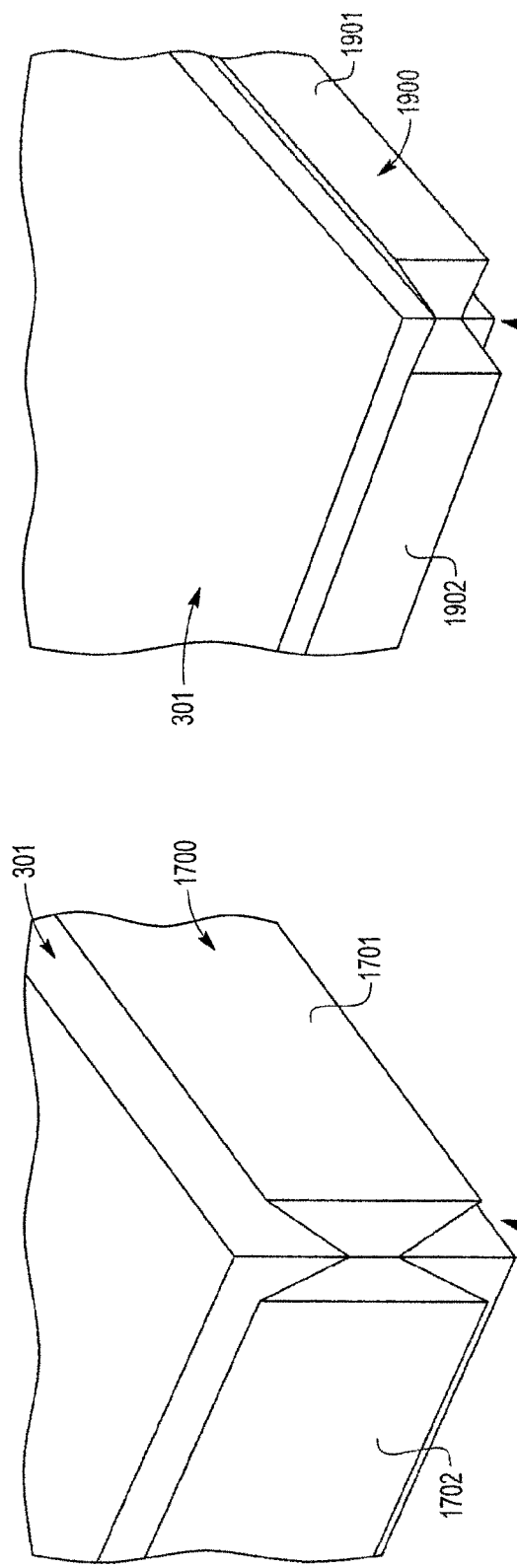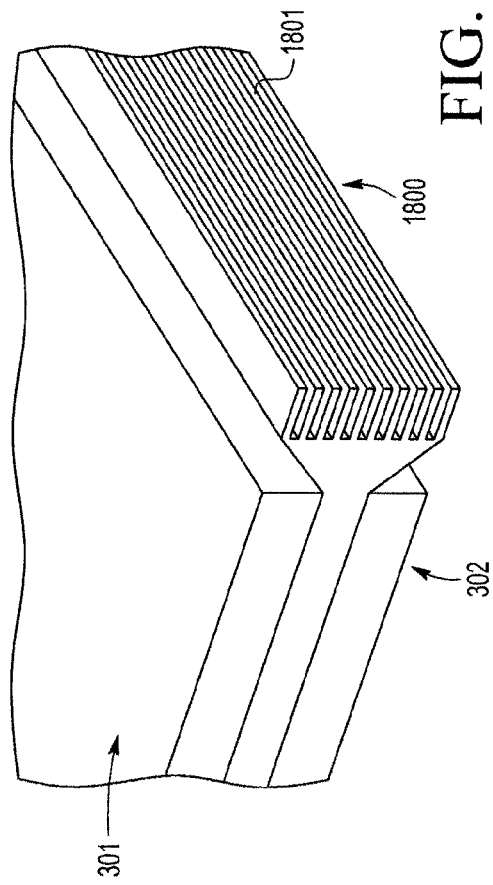

HEAT CONDUCTIVE SUBSTRATE FOR INTEGRATED CIRCUIT PACKAGE

FIELD

This disclosure relates generally to integrated circuit packaging and more particularly, to heat conducting substrates between stacked integrated circuit dies.

BACKGROUND

An integrated circuit ("IC") die is a small electronic device formed on a semiconductor wafer, such as a silicon wafer, which has formed therein electronic circuitry for performing specified operations and functions. Often, a leadframe is coupled to the IC die for providing external electrical connections to input/output ("contact") pads on the IC die.

FIG. 1 illustrates a simplified exemplary configuration 100 of an IC die 101, which in this example is packaged as a ball grid array ("BGA"), provided to illustrate certain heat dissipation problems with such IC die. The IC die 101 is mounted onto a laminate material 102, such as a substrate, board, or carrier, which has conductive balls 104 mounted thereon, which electrically interconnect to circuitry on a substrate 103. The IC die 101 may then be encapsulated within a mold 105.

The high operating temperature of the IC die 101, caused by the combination of ambient conditions and device power dissipation, is an important reliability concern. For instance, instantaneous high temperature rises can possibly cause catastrophic failure, as well as long-term degradation in the chip and package materials, both of which may eventually lead to failure. FIG. 1 also shows typical heat flow paths in such an IC die package 100 for a typical system without an exposed heat spreader or heat sink. As can be seen in FIG. 1, because of the encapsulation of the IC die 101 within the packaging, the vast majority of the heat dissipation must occur through the connections 104 and the substrate 103 on which the IC die 101 has been mounted. The stacking of multiple IC dies on top of one another in such a configuration exacerbates the foregoing problems associated with dissipation of heat.

BRIEF DESCRIPTION OF THE DRAWINGS

The present invention is illustrated by way of example and is not limited by the accompanying figures, in which like references may indicate similar elements. Elements in the figures are illustrated for simplicity and clarity and have not necessarily been drawn to scale.

FIGS. 13-19 illustrate further embodiments of the present invention.

DETAILED DESCRIPTION

Figure 1:
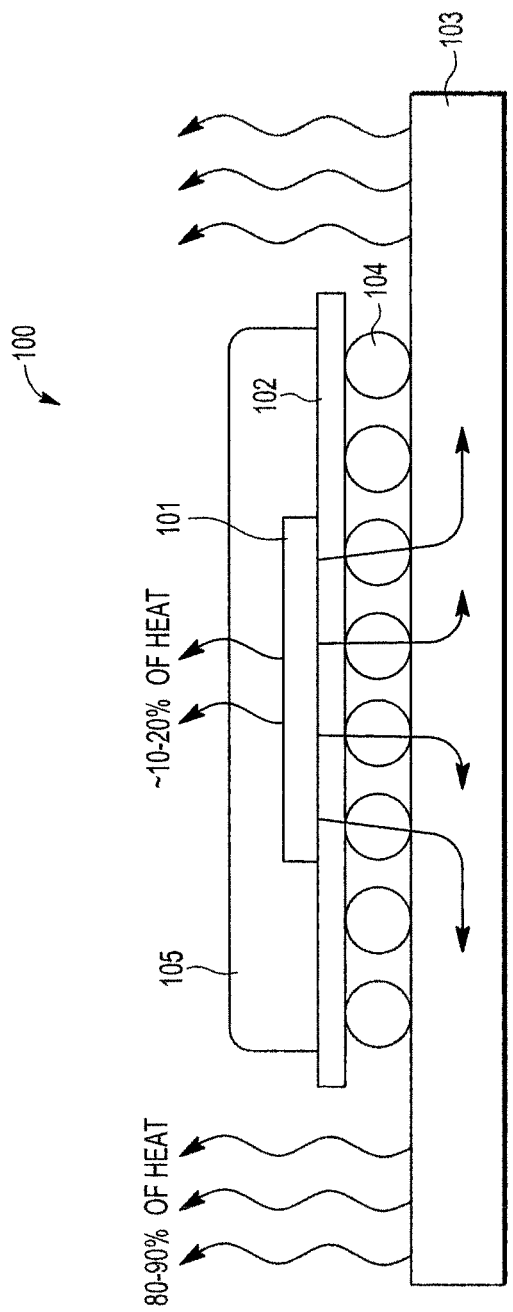
FIG. 1 illustrates an example of an integrated circuit assembly exemplifying problems with heat dissipation.

Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are now described.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

The use of the word "a" or "an" when used in conjunction with the term "comprising" in the claims and/or the specification may mean "one," but it is also consistent with the meaning of "one or more," "at least one," and "one or more than one." As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

As used in this specification and claim(s), the words "comprising" (and any form of comprising, such as "comprise" and "comprises"), "having" (and any form of having, such as "have" and "has"), "including" (and any form of including, such as "includes" and "include"), and "containing" (and any form of containing, such as "contains" and "contain") are inclusive or open-ended and do not exclude additional, unrecited elements or method steps.

An aspect of the present disclosure provides an integrated circuit package assembly comprising a substrate having a first portion and a second portion integrally formed with the first portion, wherein the second portion is thicker in dimension than the first portion, a first integrated circuit die mounted to a first side of the first portion of the substrate, and a second integrated circuit die mounted to a second side of the first portion of the substrate. The first portion may be configured as heat conducting, and the second portion may be configured as heat dissipating. In embodiments, the thicknesses of the heat conducting portion and/or the heat dissipating portion may be adjusted to accommodate the dies mounted to each side of the substrate. The heat dissipating portion's thickness may differ from the heat conducting portion's thickness by as little as 10 µm. In the integrated circuit package assembly, the first and second integrated circuit dies may each be packaged as flip-chip configurations. The first and second integrated circuit die may be mounted to opposing sides of the heat conducting portion of the substrate. The integrated circuit package assembly may further include an electrical connection between a first contact pad on the first integrated circuit die and a second contact pad on the second integrated circuit die. The heat conducting portion of the substrate may have an opening formed there through in which the electrical connection between the first contact pad on the first integrated circuit die and the second contact pad on the second integrated circuit die is located. In the integrated circuit package assembly, the heat dissipating portion may be positioned externally from a location between the first and second integrated circuit dies. The substrate may be further configured to electrically couple to electrical signal contact pads on the first or the second integrated circuit die.

The integrated circuit package assembly may further comprise a package substrate having electrical circuit traces thereon, and electrical contacts interfacing between electrical contact pads on the second die and the electrical circuit traces suitable for communicating electrical signals between the electrical contact pads and the electrical circuit traces. The semiconductor device may further comprise an encapsulant encasing at least a part of the assembly, whereby at least a part of the heat dissipating first portion is exposed to the environment and not encased within the encapsulant. The integrated circuit package assembly may further comprise a third integrated circuit die mounted on a third side of a second substrate, wherein a third active side of the third integrated circuit die faces towards the third side of the second substrate a fourth integrated circuit die mounted on a fourth side of the second substrate, wherein a fourth active side of the fourth integrated circuit die faces towards the fourth side of the second substrate, wherein the third and fourth active sides are facing towards each other, and an interface bonding a first backside of the first integrated circuit die to a second backside of the third integrated circuit die, wherein the third and fourth sides of the second substrate comprise a second heat conducting portion of the second substrate suitable for conducting heat generated by the third and fourth integrated circuit dies, and wherein the second substrate further comprises a second heat dissipating portion integrally formed with the second heat conducting portion, the second heat dissipating portion suitable for dissipating the heat conducted by the second heat conducting portion of the second substrate into the environment surrounding the integrated circuit package assembly.

An aspect of the present disclosure provides a method for forming a semiconductor device comprising mounting a first flip-chip die on a first major side of a heat conducting portion of an substrate, and mounting a second flip-chip die on a second major side of the heat conducting portion of the substrate, wherein the substrate further comprises a heat dissipating portion integrally formed with the heat conducting portion, wherein the heat dissipating portion is positioned externally from a location between the first and second flip-chip dies. The method may further comprise encapsulating the semiconductor device whereby at least a part of the heat dissipating portion is exposed from the encapsulation. The first and second flip-chip dies may be mounted with their respective active sides facing towards each other. The method may further comprise forming an electrical interconnect between a first contact pad on the first flip-chip die and a second contact pad on the second flip-chip die, wherein the electrical interconnect is positioned to pass through an opening in the heat conducting portion of the substrate. The method may further comprise mechanically grinding a backside of the mounted first flip-chip die to a level substantially level with top and bottom sides of the heat dissipating portion. The substrate may be part of an M×N array of similar substrates integrally formed with each other, wherein M and N are positive integers. The method may further comprise mounting flip-chip dies on each major side of the heat conducting portions of each substrate in the M×N array of similar substrates. The method may further comprise singulating the substrates in the M×N array from each other subsequent to the mounting of the flip-chip dies to major sides of the heat conducting portions of each substrate. The first heat dissipating portion is thicker in dimension than the first heat conducting portion.

The term "flip-chip" refers to a type of package configuration where the IC die is mounted onto a substrate (e.g., a board, leadframe, substrate, or carrier) in a "face-down" manner. Electrical connections are achieved through the contact pads (e.g., conductive bumps) built on the surface of the flip-chip, which is why the mounting process is often "face-down" in nature. During mounting, the chip is flipped onto the substrate, with the contact pads being positioned on their target locations. Flip-chip components are predominately semiconductor devices; however, components such as passive filters, detector arrays, and MEMs devices are also used in flip-chip form. Advantages of flip-chip interconnects include reduced signal inductance, power/ground inductance, and package footprint, along with higher signal density and die shrink.

Though embodiments of the present invention are described herein utilizing flip-chips, embodiments of the present invention are also applicable with respect to other IC devices that are stacked on top of each other in an IC assembly.

Figure 2:
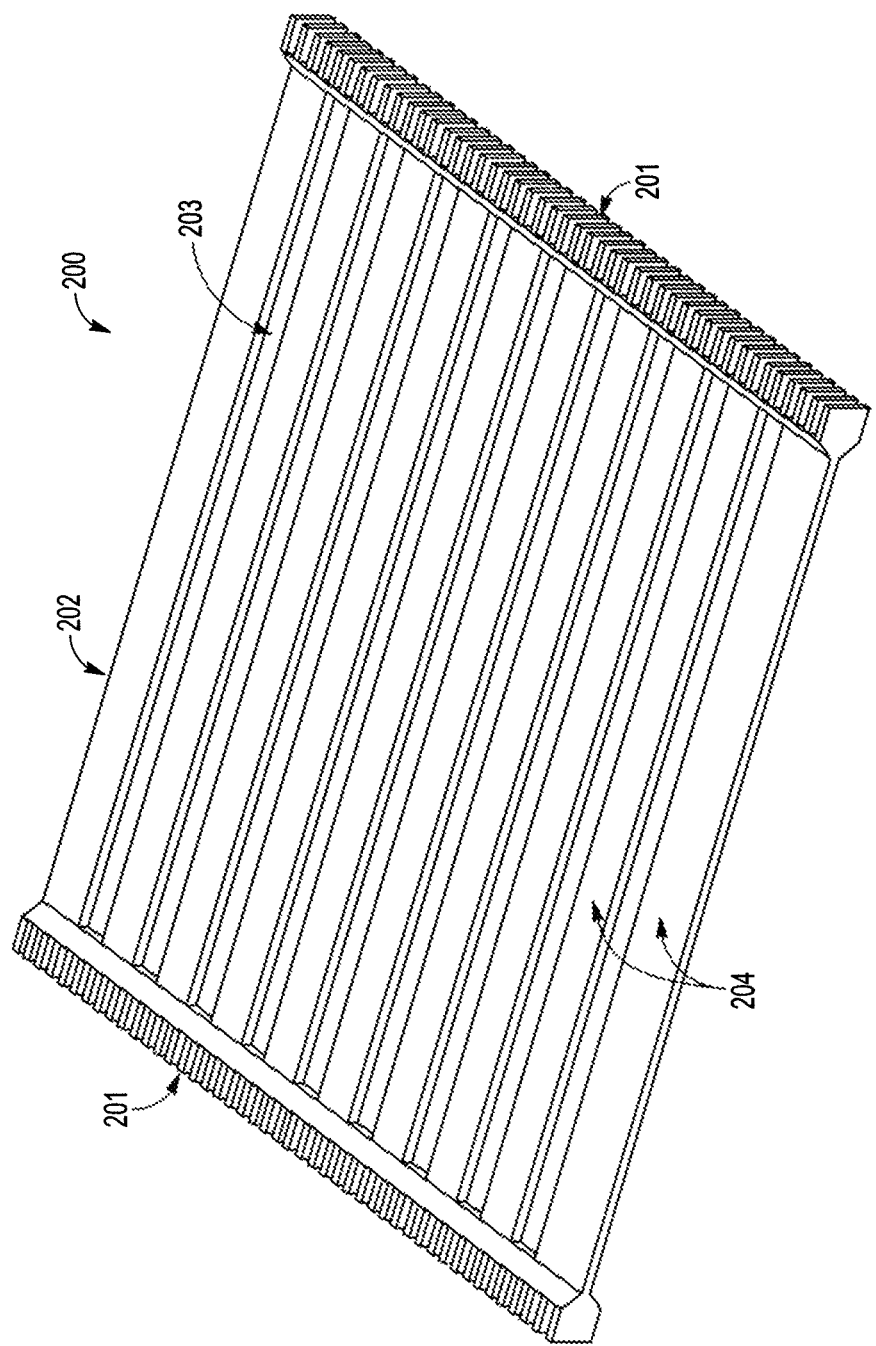
FIG. 2 illustrates a perspective view of a substrate configured in accordance with embodiments of the present invention.
Figure 3:
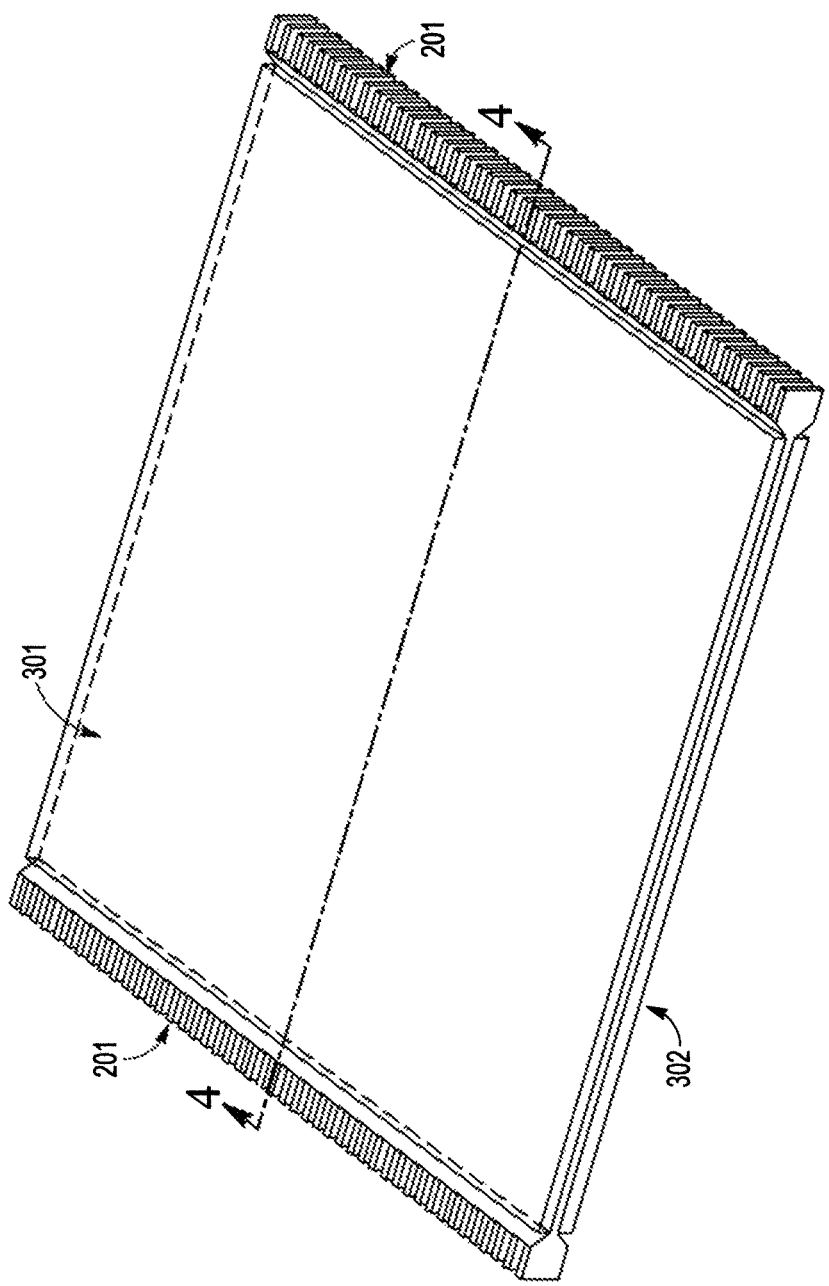
FIG. 3 illustrates a perspective view of an integrated circuit assembly in which flip-chip dies are mounted to the top and bottom of major surfaces of the substrate illustrated in FIG. 2.

FIG. 2 illustrates a substrate 200 that is configured in accordance with embodiments of the present invention to operate as a heat conducting interposer between two flip-chip dies that are mounted on opposing sides of the substrate (see, e.g., FIG. 3). Substrate 200 may also be used for electrical connection between a mounted flip chip and an external connection, such as VSS (i.e., a ground potential).

The substrate 200 may be manufactured from any material that conducts heat, including metals such as copper and dielectric materials. The substrate 200 has a first portion 202, which generally will have rectangular width and length dimensions that are similar to the corresponding dimensions of the flip-chip dies that will be mounted thereon. On at least one of the ends of the first portion 202, the substrate 200 is integrally formed to have a second portion 201. The first portion 202 is suitable for and operates to conduct heat captured from the dies towards the second portion 201, which is suitable for and operates to dissipate heat conducted from the flip-chip dies during their operation through the heat conducting first portion 202 towards the heat dissipating second portion 201. Hereinafter, the first portion 202 will also be referred to as the heat conducting portion 202, and the second portion 201 will also be referred to as the heat dissipating portion 201.

A benefit of the configurations of the substrates disclosed herein (including all variations and embodiments described and illustrated, and their equivalents) is that the heat conducting portion is made to be thin so that the overall form factor of a stack of multiple dies and substrates in between is as thin as possible, while not similarly constraining the sizes of the heat dissipating portions, which are thicker in dimension than the heat conducting portion so that the heat dissipating portions can be manufactured in a suitable manner for dissipating the heat generated by the dies and conducted to the heat dissipating portions by the thinner heat conducting portions. Moreover, since the heat dissipating portions are positioned outside of the perimeter of the dies (i.e., outside of the space in between the dies), they are therefore open to the environment outside of the multi-stack configuration of the dies, allowing the heat to dissipate into that environment away from the dies.

The embodiment illustrated in FIG. 2 has such heat dissipating portions 201 on two ends of the substrate 200, though embodiments of the present invention may have such heat dissipating portions on only one end of the substrate 200, or three or four of the ends.

The heat conducting portion 202 of the substrate 200 may have formed therein openings 203 to facilitate electrical interconnections between the flip-chip dies that are mounted on opposing major sides of the heat conducting portion 202. An example of such connections is further illustrated in FIG. 4 described hereinafter. Though the openings 203 are illustrated in FIG. 2 as multiple parallel openings or slits along one of the dimensions of the heat conducting portion 202 of the substrate 200, embodiments of the present invention are not limited to the openings as illustrated; such openings 203 may be configured in any other suitable manner that facilitates such interconnections between the flip-chip dies.

On each major side of the heat conducting portion 202 there are bond areas 204 for receiving a bonding, or adhesive, material that will then be utilized to affix, or mount, the flip-chip dies to each major side of the heat conducting portion 202.

The substrate 200, including shaping of the heat dissipating portion(s) 201 (including any heat dissipating "fins" formed thereon, or an equivalent heat dissipating configuration), may be formed using various well-known methods, such as mechanical stamping (also referred to as "coining"), etching processes, or both. Furthermore, any other manufacturing process that would produce the disclosed substrates in accordance with embodiments of the present invention may be utilized.

FIG. 3 illustrates a perspective view of an integrated circuit assembly in which two flip-chip die have been mounted to a substrate in accordance with embodiments of the present invention. A first flip-chip die 301 is mounted on a first, or top, major side of the heat conducting portion 202 of the substrate 200, while a second flip-chip die 302 is mounted to a second, or bottom, or side of the heat conducting portion 202 of the substrate 200. As will be further, discussed hereinafter, the dies 301, 302 may be mounted to the major sides of the heat conducting portion 202 using a bonding or adhesive material, which may be formulated to conduct heat from the dies 301, 302 to the heat conducting portion 202.

Figure 4:
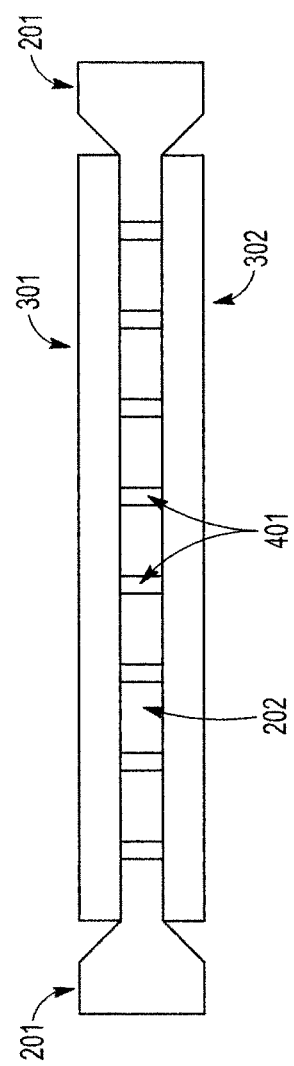
FIG. 4 illustrates a cross-section view of the integrated circuit assembly illustrated in FIG. 3.

Though not shown in detail in FIG. 3, each of the dies 301, 302 are mounted to the heat conducting portion major surfaces with their respective active sides having the contact pads facing towards the major surfaces of the heat conducting portion 202, and as a result facing each other so that electrical connections between the contact pads of the two dies 301, 302 can be facilitated as further described with respect to FIG. 4. Electrical connections between specified ones of the contact pads on specified die(s) may also be made to a separate leadframe (not shown) inserted within the integrated circuit assembly in a well-known manner, and/or to specified portions of the substrate 200 that have been configured to conduct such electrical signals externally from the integrated circuit assembly. Clearance openings in either or both of the substrate 200 and separate leadframe may be implemented in order to facilitate interconnections between one or both of the dies 301, 302 to the separate leadframe and/or each other.

Connections between the dies 301 and 302 may be made in a well-known manner whereby the interconnects between the dies 301 and 302 are facilitated by the openings 203 in the heat conducting portion 202. This is further illustrated in the cross-section view in FIG. 4, which shows such interconnects, which may comprise solder bumps or metal (e.g., copper) pillars 401, which contact specified contact pads on the dies 301, 302. Proper spacing between the interconnects 401 and sides of the openings 203 may be implemented to prevent shorting between the two, or an insulating layer may be applied to sides of the openings.

Since the heat dissipating portion(s) 201 are integrally manufactured with the heat conducting portion 202 of the substrate 200, as heat is conducted from the flip-chip dies 301, 302 to the heat conducting portion 202, the heat is then conducted out towards the heat dissipating portion(s) 201, which are external to the finalized integrated circuit assembly so that the heat can dissipate away from the assembly into the surrounding environment.

Figure 5:
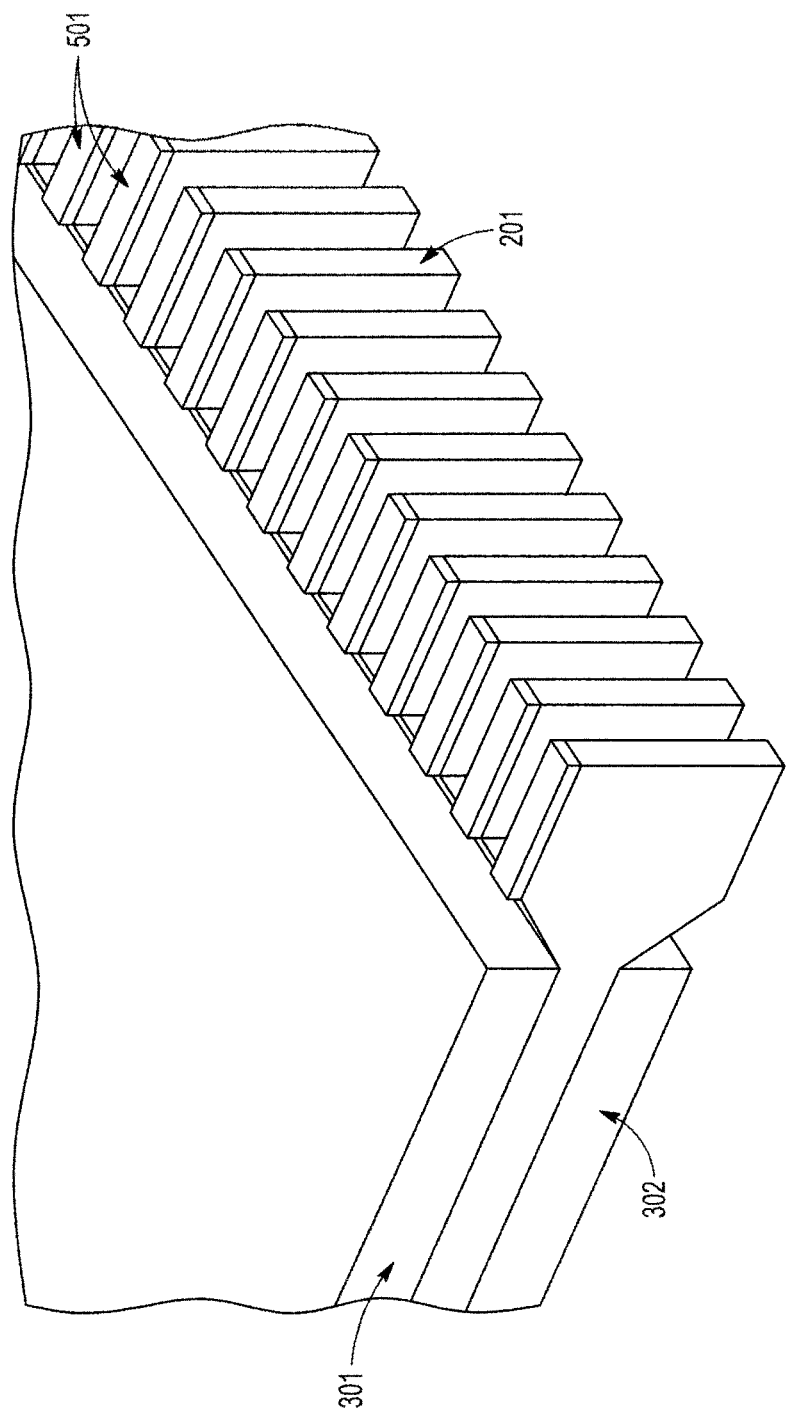
FIG. 5 illustrates pre-coating of a bonding agent to the heat sink portion of a substrate for connecting multiple substrate structures together in accordance with embodiments of the present invention.

FIG. 5 illustrates a portion of integrated circuit assembly 300 such as previously discussed with respect to FIGS. 3-4. FIG. 5 illustrates the application of a bonding material bonding material 501 to the top and/or bottom edges of the heat dissipating portion 201 to facilitate connecting multiple integrated circuit assemblies in a stacked configuration, such as will be further described hereinafter (see, e.g., FIG. 12). Any material appropriate for bonding two surfaces may be utilized for the bonding material 501, such as solder. The bonding material 501 further provides a heat conduction path between the heat dissipating portions 201 of such multiple stacked structures.

FIGS. 6 and 7-11 illustrate a process for manufacturing an M×N array (wherein M and N are each positive integers) of integrated circuit assemblies, wherein each of the integrated circuit assemblies is configured similar to the assembly illustrated in FIG. 3. In the following discussion, the flow diagram illustrated in FIG. 6 will be used along with FIGS. 7-11 to describe such a process.

Figure 6:
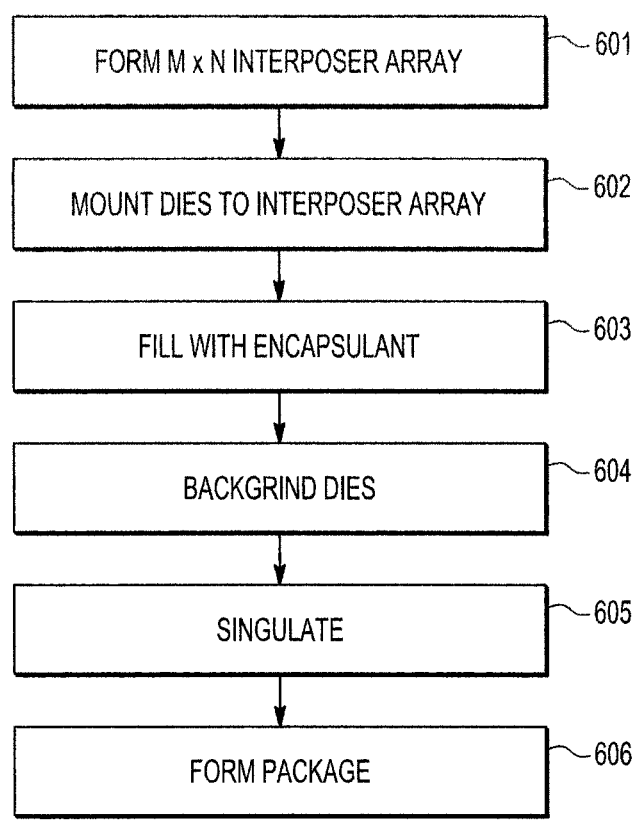
FIG. 6 illustrates a flow diagram for manufacturing integrated circuit assemblies in accordance with embodiments of the present invention.

Referring to FIG. 6, an M×N substrate array 700 is formed in step 601, meaning that a single array of M×N substrates is integrally formed from which the individual substrates 200 will be packaged with dies 301, 302 (such as illustrated in FIG. 3) as further described hereinafter.

Figure 7:
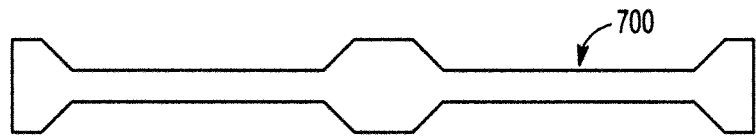
FIGS. 7-11 illustrate a process for manufacturing an M×N array of integrated circuit assemblies in accordance with embodiments of the present invention.
Figure 8:
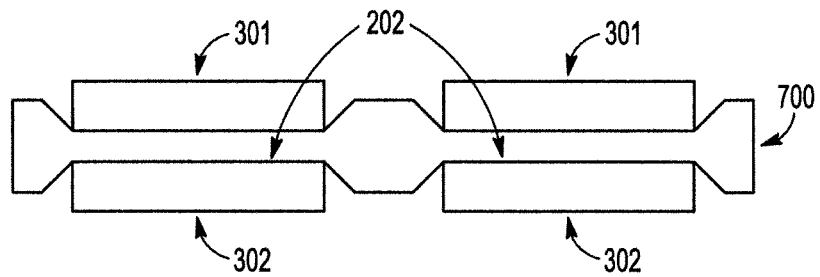

FIG. 7 illustrates a side view of the M×N array 700 of substrates, which may have been manufactured in a manner as disclosed herein, including by mechanical stamping, or etching, or a combination of both. Next, referring to FIGS. 6 and 8, multiple ones of the integrated circuit dies 301, 302 are mounted in step 602 to each major side of the heat conducting portion 202 of each of the substrates 200 within the M×N array 700. Note that each of the dies 301, 302 may be mounted with their respective active sides facing each other through the heat conducting portion(s) 202 of each of the substrates 200. The electrical interconnections 401 (see FIG. 4) between dies 301, 302 may then be made as previously disclosed. Furthermore, as previously noted, a separate leadframe(s) may be inserted between various ones of the dies 301, 302 for facilitating electrical connections from the dies 301, 302 to an external location(s) from the resulting integrated circuit package. Alternatively, portions of the substrate(s) 200 may be utilized for facilitating such electrical connections from the dies 301, 302 to external locations, such as further disclosed hereinafter with respect to FIGS. 20-21.

Figure 9:
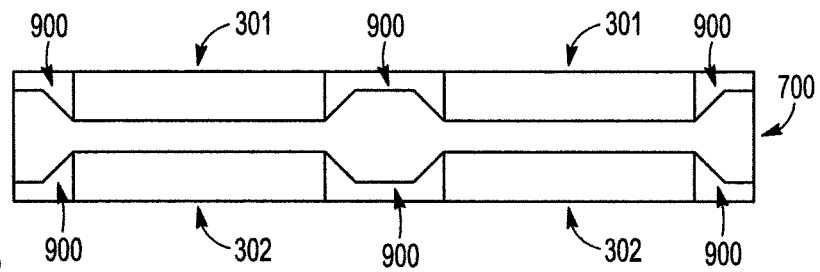

FIG. 9 illustrates a next step 603 within the manufacturing process whereby specified gaps are filled with an encapsulant 900. Such an encapsulant may also assist in supporting the dies 301, 302 as mounted to the substrate(s) 200 during the backgrinding and singulation processes described hereinafter.

Figure 10:
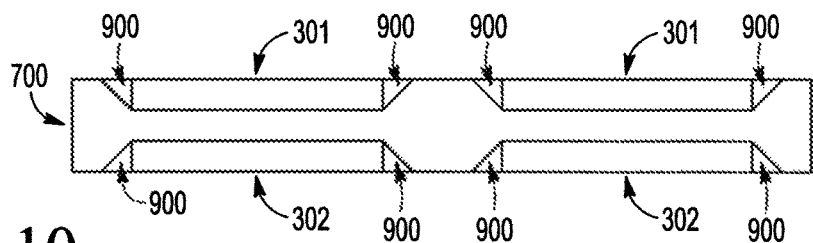

Thereafter, referring to FIGS. 6 and 10, the back sides (i.e., the "non-active" sides) of the dies 301, 302 are mechanically ground to a level substantially even with the top and bottom edges of the heat dissipating portions 201. Such mechanical grinding processes are well-known in the IC manufacturing industry, and are often referred to as "backgrinding."

By utilizing the manufacturing technique illustrated in FIGS. 7-11, such integrated circuit dies may be processed for implementing the specific integrated circuitry for each of the die at a first standard thickness that enables these dies to be physically handled without placing excessive physical stresses upon these dies, which could damage the integrated circuitry through such handling. Then, after mounting the dies 301, 302 to the substrates 200, the dies 301, 302 may be mechanically ground to a desired thinner dimension for further minimizing the resultant form factor of the integrated circuit assemblies 300.

Figure 11:
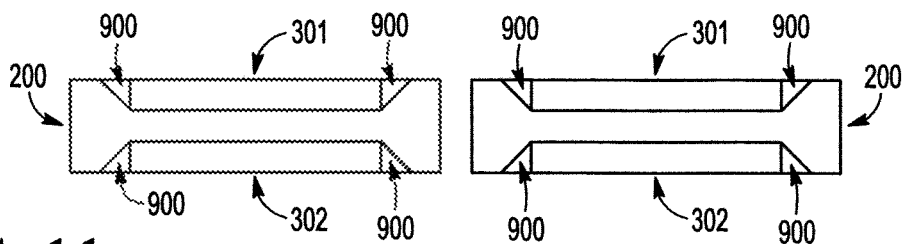

FIG. 11 illustrates a step 605 whereby individual integrated circuit assemblies may be singulated from each other as individual assemblies (300 in FIG. 3) or combinations of arrays of such assemblies. Such singulation processes, which may utilize a mechanical saw or laser, are well-known in the semiconductor manufacturing industry. The singulation will result in an exposure of at least the edges of the heat dissipating portions 201 of the substrates 200. It is to be further noted that the previously disclosed encapsulation 603 (see FIG. 9) does not result in an encapsulation of these edges of the heat dissipating portions 201, because it is these heat dissipating portions 201 of the substrates 200 that are to be outside of the encapsulated integrated circuit assembly packages so that the heat conducted from the flip-chip dies 301, 302 through the heat conducting portion(s) 202 to the heat dissipating portions 201 can be dissipated externally from such assemblies.

Referring again to FIG. 6, in step 606, various combinations of the assemblies 300 and/or arrays thereof, may be further processed into final packages for final implementation. An example of such a configuration 2200 is illustrated in FIG. 22, where a stacked assembly of flip-chips 301-302 with an substrate 200 in between (such as the assemblies illustrated in FIG. 11) is positioned on a substrate 2203 so that the electrical contacts 2204 interface with electrical circuit traces on the substrate 2203 (not shown for the sake of simplicity) for communicating electrical signals between the stacked assembly of flip-chips 301-302 and the electrical circuit traces, which may then electrically communicate with other electronic circuit elements (not shown) mounted elsewhere on the substrate 2203 or an adjoining substrate, as is well-known in the art. For example, through silicon vias may be formed through the back of the die(s) to facilitate connections with circuitry outside of the stacked assembly. Or, substrates such as described with respect to FIGS. 20-21 may be utilized between one or more dies in a stacked assembly to facility such electrical connections.

Note that any number of the assemblies 300 may be stacked upon each other, such as the stacked configuration described hereinafter with respect to FIG. 12. Moreover, the substrates utilized in such stacked assemblies may be configured in accordance with any of the embodiments disclosed herein.

As can be seen from the exemplary configuration in FIG. 22, heat generated by the flip-chips is conducted by the heat conducting portion of the substrate towards its heat dissipating portion(s), which are exposed to the environment surrounding the semiconductor device or assembly so that such heat is able to dissipate into the environment. In various embodiments in which such flip-chips are packaged, if an encapsulant is utilized to encase any portion of the assembly, at least some part of the heat dissipating portion(s) will not be encased within such an encapsulant, but instead will be exposed to the surrounding environment. The foregoing will also be true with respect to embodiments in which there is a multi-stack of more than two flip-chips on top of one another, such as depicted in FIG. 12.

Figure 12:
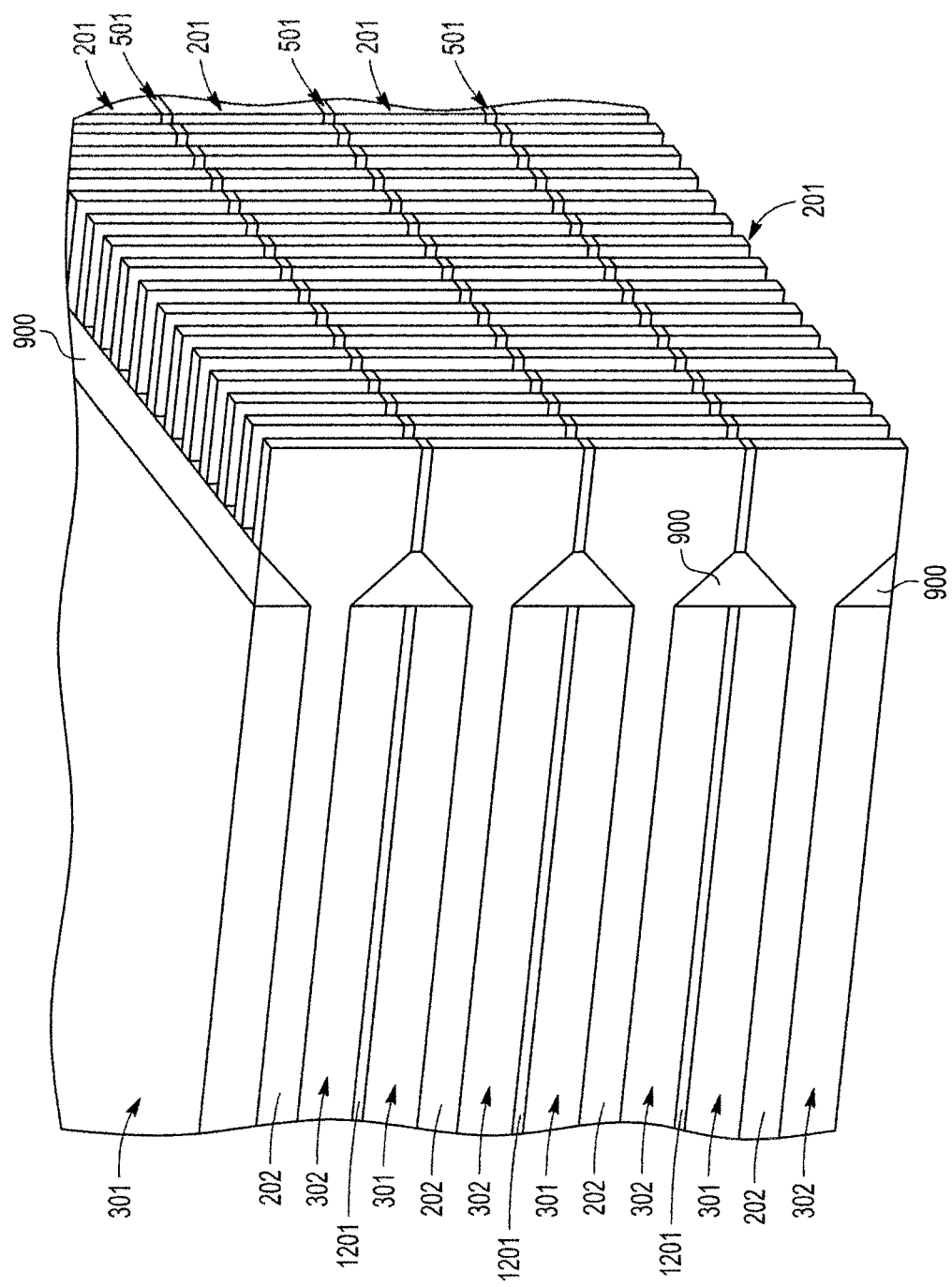
FIG. 12 illustrates an example of an integrated circuit assembly of multiple dies and substrates configured in accordance with embodiments of the present invention.

FIG. 12 illustrates a portion of an example of such an integrated circuit assembly comprising a structure of four substrates 200 on which are mounted flip-chip dies 301, 302 on each of the major sides of the heat conducting portions 201 of the substrates 200, and then these integrated circuit assemblies are stacked on top of one another. In performing such a stacking of the integrated circuit assemblies, a bond or adhesive 1201 may be utilized as an interface to bond the backsides of the flip-chip dies 301, 302, while the bonding material 501 may be utilizing for bonding together adjacent heat dissipating portions 201 of the substrates 200. Note that the assembly may be configured so that the backsides of the flip-chip dies are in contact, with no adhesive, or there may be an air gap between the dies. Though FIG. 12 illustrates an example of four integrated circuit assemblies stacked upon each other, embodiments of the present invention are not limited to such a number of stacked assemblies. Moreover, an M×N array of such stacked assemblies may be mounted to each other as an alternative.

Figure 13:
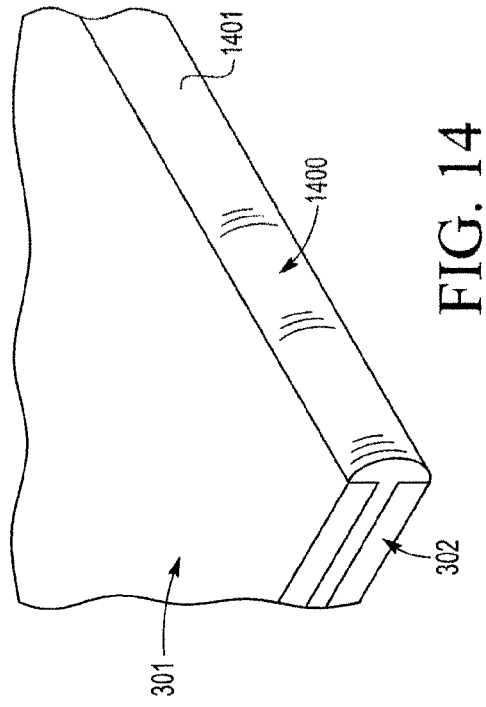

FIG. 13 illustrates an alternative embodiment of an integrated circuit assembly similar to assembly 300 previously described with respect to FIG. 3, but where the heat dissipating portion 1301 of substrate 1300 has essentially a solid triangular shape along its lengthwise dimension for dissipating heat generated by the flip-chips 301-302.

Figure 14:
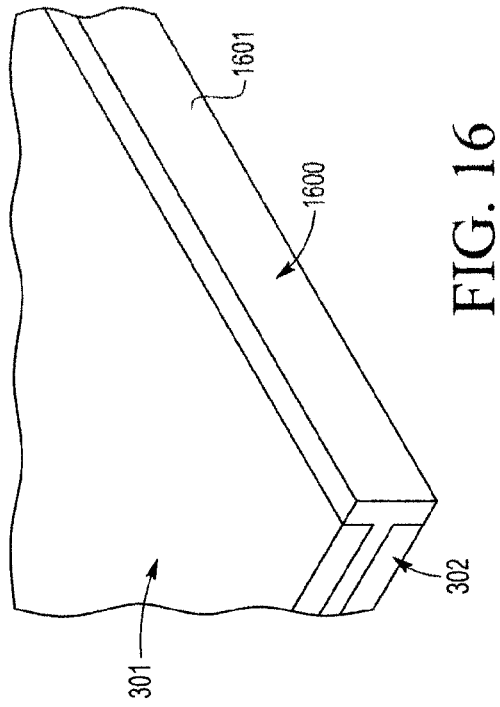

FIG. 14 illustrates an alternative embodiment of an integrated circuit assembly similar to the assembly 300 previously described with respect to FIG. 3, but where the heat dissipating portion 1401 of the substrate 1400 has essentially a semicircular shape along its lengthwise dimension for dissipating heat generated by the flip-chips 301-302, which may incorporate multiple fins (not shown) along the length of the heat dissipating portion 1401, similar to the heat sink fins 201.

Figure 15:
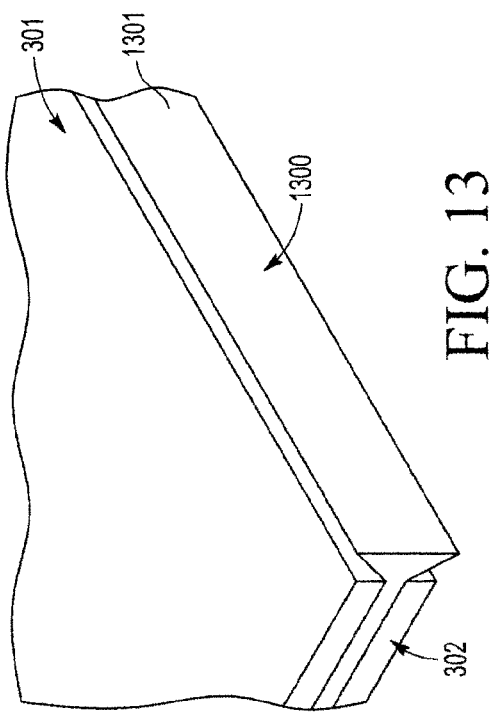

FIG. 15 illustrates an alternative embodiment of an integrated circuit assembly similar to the assembly 300 previously described with respect to FIG. 3, but where the heat dissipating portion 1501 of the substrate 1500 has essentially a truncated triangular shape along its lengthwise dimension for dissipating heat generated by the flip-chips 301-302, which may incorporate multiple fins (not shown) along the length of the heat dissipating portion 1501, similar to the heat sink fins 201.

Figure 16:
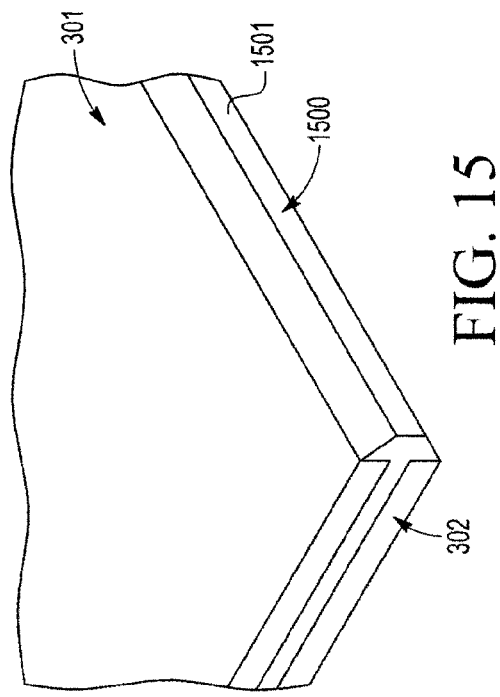

FIG. 16 illustrates an alternative embodiment of an integrated circuit assembly similar to the assembly 300 previously described with respect to FIG. 3, but where the heat dissipating portion 1601 of the substrate 1600 has essentially a rectangular shape for dissipating heat generated by the flip-chips 301-302, which may incorporate multiple fins (not shown) along the length of the heat dissipating portion 1601, similar to the heat sink fins 201.

FIG. 17 illustrates an alternative embodiment of an integrated circuit assembly similar to the assembly 300 previously described with respect to FIG. 3, but where the heat dissipating portions 1701-1702 of the substrate 1700 have essentially solid triangular shapes along their lengthwise dimensions on at least two ends of the substrate 1700 for dissipating heat generated by the flip-chips 301-302.

FIG. 19 illustrates an alternative embodiment of an integrated circuit assembly similar to the assembly 300 previously described with respect to FIG. 3, but where the heat dissipating portions 1901-1902 of the substrate 1900 have essentially solid triangular shapes along their lengthwise dimensions on at least two ends of the substrate 1900 for dissipating heat generated by the flip-chips 301-302. Note that the substrate 1700 illustrated in FIG. 17 is similar to the substrate 1900 except that the heat dissipating portions 1701-1702 are smaller in overall dimension than the heat dissipating portions 1901-1902. This illustrates that any of the heat dissipating portions disclosed herein may be made of different size dimensions than those specifically described.

FIG. 18 illustrates an alternative embodiment of an integrated circuit assembly similar to the assembly 300 previously described with respect to FIG. 3, but where the heat dissipating portion 1801 of the substrate 1800 has essentially its heat dissipating fins configured along its lengthwise dimension for dissipating heat generated by the flip-chips 301-302.

Figure 20:
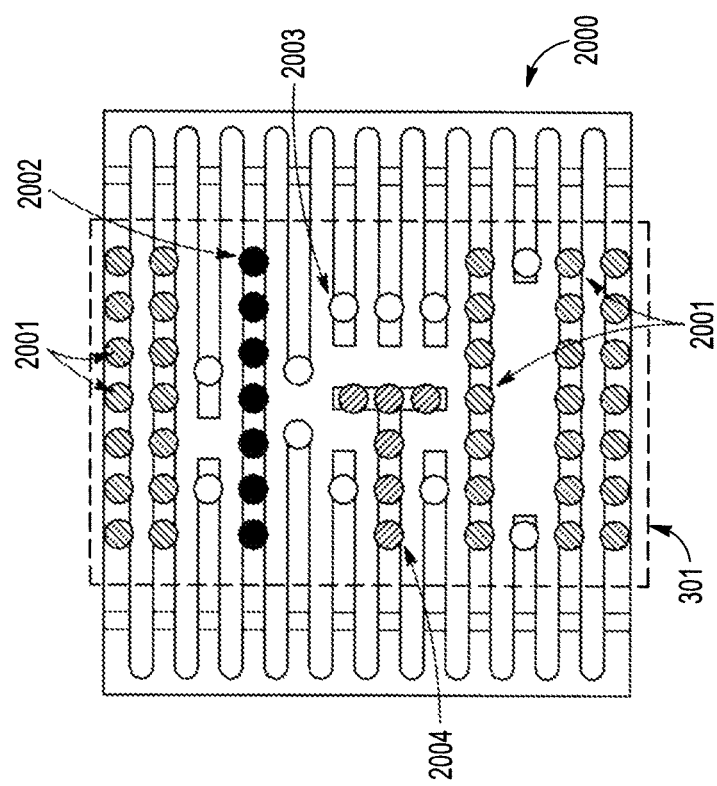
FIGS. 20-21 illustrate an alternative embodiment of the present invention.
Figure 21:
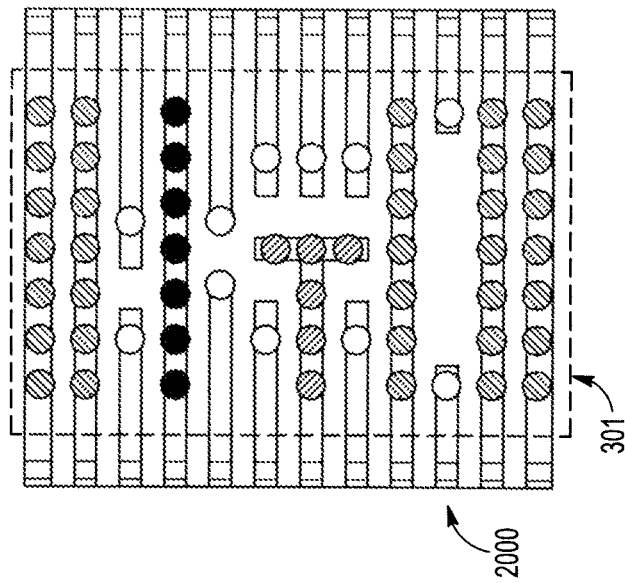
Figure 22:
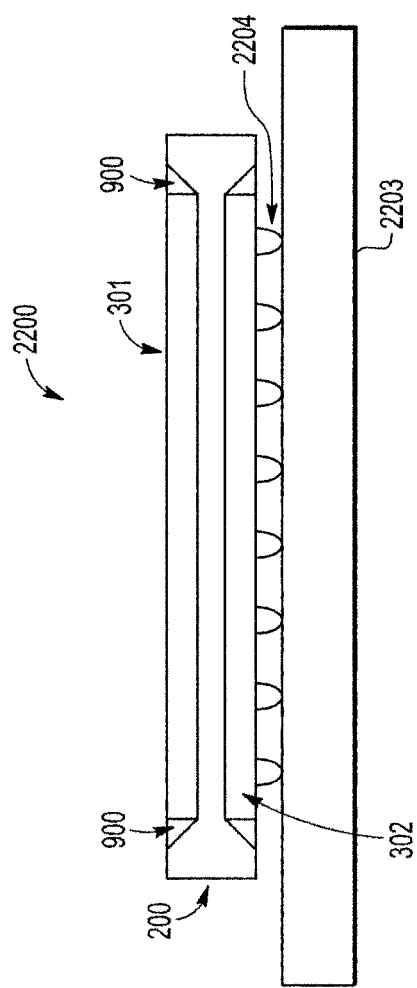
FIG. 22 illustrates an integrated circuit assembly configured in accordance with embodiments of the present invention.

FIGS. 20-21 illustrate embodiments of a substrate configured with electrical contact points for coupling to electrical signal contact pads on one or more of the flip-chips 301-302. Referring to FIG. 20, there is illustrated a top elevation view of an example of a substrate 2000 at a point in the manufacturing process previous to when the substrate 2000 is singulated, or trimmed, for example, previous to step 605 of FIG. 6. Various ones of the connections for conducting heat 2001, and the electrical signals, such as data 2003, power 2004, and ground 2002, may be implemented at selected points on the substrate 2000 so that such connections appropriately interconnect with corresponding points and electrical signal contact pads (not shown) on the flip-chip(s) 301-302. Such interconnections are not shown, but a dashed-line outline of a flip-chip 301 is provided to indicate how such electrical contact points would be positioned to interface with the corresponding points and electrical signal contact pads of a mounted flip-chip 301. The "dots" 2001-2004 shown in FIGS. 20-21 are merely symbolic of where such interconnections may be made on the substrate 2000. Such interconnections may be made with well-known solder bumps.

FIG. 21 illustrates the substrate 2000 after the substrate 2000 is singulated or trimmed. Because portions of the substrate 2000 will be conducting one or more of various electrical signals (e.g., data, power, ground) and heat, these portions are electrically isolated from each other. Nevertheless, at least the portions of the substrate 2000 conducting heat from the flip-chips 301-302 will be configured with heat dissipating portions, which may be configured in accordance with any of the embodiments described herein with respect to FIGS. 3 and 13-19.

It should be noted that the substrate 2000 illustrated in FIGS. 20-21 is merely an example of how such a substrate may be configured. Any number of variations in this configuration may be implemented in order to facilitate interconnections with the various power and signal contact pads on a die.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit package assembly comprising:
a first substrate having a first portion and a second portion integrally formed with the first portion, wherein the second portion is thicker in dimension than the first portion;
a first integrated circuit die mounted to a first side of the first portion of the first substrate; and
a second integrated circuit die mounted to a second side of the first portion of the first substrate,
wherein a first active side of the first integrated circuit die faces towards the first side of the first portion, and wherein a second active side of the second integrated circuit die faces towards the second side of the first portion, wherein the first and second active sides are facing towards each other,
wherein the first portion serves as a first heat conducting portion of the first substrate suitable for conducting heat generated by the first and second integrated circuit dies, and wherein the second portion serves as a first heat dissipating portion integrally formed with the first heat conducting portion, the first heat dissipating portion suitable for dissipating the heat conducted by the first heat conducting portion of the first substrate into an environment surrounding the integrated circuit package assembly.

2. The integrated circuit package assembly as recited in claim 1, wherein the first and second integrated circuit dies are each packaged as flip-chip configurations.

3. The integrated circuit package assembly as recited in claim 1, wherein the first and second integrated circuit die are mounted to opposing sides of the first portion of the substrate, the integrated circuit package assembly further comprising an electrical connection between a first contact pad on the first integrated circuit die and a second contact pad on the second integrated circuit die.

4. The integrated circuit package assembly as recited in claim 3, wherein the first portion of the substrate has an opening formed there through in which the electrical connection between the first contact pad on the first integrated circuit die and the second contact pad on the second integrated circuit die is located.

5. The integrated circuit package assembly as recited in claim 1, wherein the second portion is positioned externally from a location between the first and second integrated circuit dies.

6. The integrated circuit package assembly as recited in claim 1, wherein the first substrate is further configured to electrically couple to electrical signal contact pads on the first integrated circuit die.

7. The integrated circuit package assembly as recited in claim 1, wherein the second portion is positioned externally from a perimeter around the first and second integrated circuit dies.

8. An integrated circuit package assembly comprising:
a first substrate having a first portion and a second portion integrally formed with the first portion, wherein the second portion is thicker in dimension than the first portion;
a first integrated circuit die mounted to a first side of the first portion of the first substrate; and
a second integrated circuit die mounted to a second side of the first portion of the first substrate, wherein a first active side of the first integrated circuit die faces towards the first side of the first portion, and wherein a second active side of the second integrated circuit die faces towards the second side of the first portion, wherein the first and second active sides are facing towards each other, the integrated circuit package assembly further comprising:
a package assembly substrate having electrical circuit traces thereon; and
electrical contacts interfacing between electrical contact pads on the second integrated circuit die and the electrical circuit traces suitable for communicating electrical signals between the electrical contact pads and the electrical circuit traces,
wherein the first portion serves as a first heat conducting portion of the first substrate suitable for conducting heat generated by the first and second integrated circuit dies, and wherein the second portion serves as a first heat dissipating portion integrally formed with the first heat conducting portion, the first heat dissipating portion suitable for dissipating the heat conducted by the first heat conducting portion of the first substrate into an environment surrounding the integrated circuit package assembly.

9. The integrated circuit package assembly as recited in claim 8, wherein the first heat dissipating portion is positioned externally from a perimeter around the first and second integrated circuit dies.

10. The integrated circuit package assembly as recited in claim 9, further comprising an encapsulant encasing at least a part of the integrated circuit package assembly, whereby at least a part of the first heat dissipating portion is exposed to the environment and not encased within the encapsulant.

11. The integrated circuit package assembly as recited in claim 9, wherein the first heat dissipating portion includes heat dissipating fins formed therein.

12. The integrated circuit package assembly as recited in claim 9, further comprising:
a third integrated circuit die mounted on a third side of a second substrate, wherein a third active side of the third integrated circuit die faces towards the third side of the second substrate;
a fourth integrated circuit die mounted on a fourth side of the second substrate, wherein a fourth active side of the fourth integrated circuit die faces towards the fourth side of the second substrate, wherein the third and fourth active sides are facing towards each other; and
an interface bonding a first backside of the first integrated circuit die to a second backside of the third integrated circuit die, wherein the third and fourth sides of the second substrate serve as a second heat conducting portion of the second substrate suitable for conducting heat generated by the third and fourth integrated circuit dies, and wherein the second substrate further comprises a second heat dissipating portion integrally formed with the second heat conducting portion, the second heat dissipating portion suitable for dissipating the heat conducted by the second heat conducting portion of the second substrate into the environment surrounding the integrated circuit package assembly.

13. An integrated circuit package assembly comprising:
a first heat conducting interposer having a first heat conducting portion and a first heat dissipating portion integrally formed with the first heat conducting portion, wherein the first heat dissipating portion is thicker in dimension than the first heat conducting portion;
a first flip-chip die affixed to a first side of the first heat conducting portion of the first heat conducting interposer, wherein the first flip-chip die includes a first active side having a first plurality of electrical interconnects for transferring electrical signals to and from circuitry within the first flip-chip die and circuitry external to the first flip-chip die; and
a second flip-chip die affixed to a second side of the first heat conducting portion of the first heat conducting interposer, wherein the second flip-chip die includes a second active side having a second plurality of electrical interconnects for transferring electrical signals to and from circuitry within the second flip-chip die and circuitry external to the second flip-chip die, wherein the first and second flip-chip dies are affixed to the first and second sides of the first heat conducting portion so that the first active side of the first flip-chip die is facing the second active side of the second flip-chip die, wherein the first heat conducting portion of the first heat conducting interposer is configured for conducting heat generated by the first and second flip-chip dies to the first heat dissipating portion that is configured for dissipating the heat into an environment surrounding the integrated circuit package assembly, wherein the first heat dissipating portion is positioned externally from a location between the first and second flip-chip dies.

14. The integrated circuit package assembly as recited in claim 13, further comprising a plurality of electrical connections between the first plurality of electrical interconnects on the first active side of the first flip-chip die and the second plurality of electrical interconnects on the second active side of the second flip-chip die.

15. The integrated circuit package assembly as recited in claim 14, wherein the first heat conducting portion of the first heat conducting interposer has an opening formed there through in which the plurality of electrical connections are located, wherein the opening lies directly between the first and second active sides.

16. The integrated circuit package assembly as recited in claim 13, further comprising an encapsulant encasing at least a part of the integrated circuit package assembly, whereby at least a part of the first heat dissipating portion is exposed to the environment and not encased within the encapsulant.

17. The integrated circuit package assembly as recited in claim 13, wherein the first heat dissipating portion includes heat dissipating fins formed therein.

18. The integrated circuit package assembly as recited in claim 13, further comprising:
a second heat conducting interposer having a second heat conducting portion and a second heat dissipating portion integrally formed with the second heat conducting portion;
a third flip-chip die affixed to a third side of the second heat conducting portion of the second heat conducting interposer, wherein the third flip-chip die includes a third active side having a third plurality of electrical interconnects for transferring electrical signals to and from circuitry within the third flip-chip die and circuitry external to the third flip-chip die;
a fourth flip-chip die affixed to a fourth side of the second heat conducting portion of the second heat conducting interposer, wherein the fourth flip-chip die includes a fourth active side having a fourth plurality of electrical interconnects for transferring electrical signals to and from circuitry within the fourth flip-chip die and circuitry external to the fourth flip-chip die, wherein the third and fourth flip-chip dies are affixed to the third and fourth sides of the second heat conducting portion so that the third active side of the third flip-chip die is facing the fourth active side of the fourth flip-chip die, wherein the second heat conducting portion of the second heat conducting interposer is configured for conducting heat generated by the third and fourth flip-chip dies to the second heat dissipating portion that is configured for dissipating the heat into the environment surrounding the integrated circuit package assembly; and an interface bonding a first backside of the first flip-chip die to a second backside of the third flip-chip die.

19. The integrated circuit package assembly as recited in claim 18, further comprising:

a first plurality of electrical connections between the first plurality of electrical interconnects on the first active side of the first flip-chip die and the second plurality of electrical interconnects on the second active side of the second flip-chip die, wherein the first heat conducting portion of the first heat conducting interposer has a first opening formed there through in which the first plurality of electrical connections are located, wherein the first opening lies directly between the first and second active sides; and a second plurality of electrical connections between the third plurality of electrical interconnects on the third active side of the third flip-chip die and the fourth plurality of electrical interconnects on the fourth active side of the fourth flip-chip die, wherein the second heat conducting portion of the second heat conducting interposer has a second opening formed there through in which the second plurality of electrical connections are located, wherein the second opening lies directly between the third and fourth active sides.

* * * * *